US012665565B2

(12) United States Patent
Stolt et al.

(10) Patent No.: US 12,665,565 B2
(45) Date of Patent: Jun. 23, 2026

(54) APPARATUSES AND METHODS INVOLVING SUPPRESSION OF SPURIOUS MODES IN RESONATOR-BASED CIRCUITS

(71) Applicants: The Board of Trustees of the Leland Stanford Junior University, Stanford, CA (US); Board of Regents, The University of Texas System, Austin, TX (US)

(72) Inventors: Eric Stolt, Stanford, CA (US); Juan Rivas-Davila, Palo Alto, CA (US); Weston Braun, Stanford, CA (US); Ruochen Lu, Austin, TX (US); Kristi Nguyen, Santa Clara, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 57 days.

(21) Appl. No.: 18/631,914

(22) Filed: Apr. 10, 2024

(65) Prior Publication Data

US 2024/0348228 A1     Oct. 17, 2024

Related U.S. Application Data

(60) Provisional application No. 63/459,462, filed on Apr. 14, 2023.

(51) Int. Cl.
*H03H 9/02* (2006.01)
*H03H 9/17* (2006.01)
*H10N 30/853* (2023.01)

(52) U.S. Cl.
CPC .......... *H03H 9/02086* (2013.01); *H03H 9/17* (2013.01); *H10N 30/8542* (2023.02)

(58) Field of Classification Search
CPC ... H03H 9/02086; H03H 9/17; H10N 30/8542
See application file for complete search history.

(56) References Cited

U.S. PATENT DOCUMENTS 6,667,566 B2 * 12/2003 Kim ...................... H10N 30/40
                                                                310/365
7,012,353 B2 * 3/2006 Iwata ..................... H03H 9/132
                                                                29/25.35

(Continued)

OTHER PUBLICATIONS

Boles, Jessica D., et al. "Piezoelectric-based power conversion: Recent progress, opportunities, and challenges." 2022 IEEE Custom Integrated Circuits Conference (CICC). IEEE, 2022. (Abstract only).

(Continued)

*Primary Examiner* — Quan Tra
(74) *Attorney, Agent, or Firm* — Mueting Raasch Group

(57) ABSTRACT

In certain examples, methods and apparatus are directed to a resonator-based circuit which, in operation, has an electrically-conductive band ("band") at least partially surrounding a center electrode which includes the piezoelectric material of the circuit's resonator. In particular examples, the band acts to electrically load vibrations near resonance and consequently, spurious mode suppression is realized. In more particular example embodiments, the band maintains TE mode while eliminating lateral spurious tones, and in one application-specific example, the resonator-based circuitry and the electrical-conductive band are to provide of facilitate piezoelectric power conversion.

23 Claims, 7 Drawing Sheets

(56) References Cited

U.S. PATENT DOCUMENTS

| | | | | |
|---|---|---|---|---|
| 7,579,753 | B2 * | 8/2009 | Fazzio | G01H 11/08 |
| | | | | 310/366 |
| 7,893,793 | B2 * | 2/2011 | Iwasaki | H03H 9/564 |
| | | | | 333/133 |
| 2002/0030424 | A1 * | 3/2002 | Iwata | H03H 9/174 |
| | | | | 310/365 |
| 2004/0195937 | A1 * | 10/2004 | Matsubara | H03H 9/02102 |
| | | | | 310/320 |
| 2021/0159874 | A1 * | 5/2021 | Yang | H03H 9/568 |

OTHER PUBLICATIONS

Kaitila, J., et al. "Spurious resonance free bulk acoustic wave resonators." IEEE Symposium on Ultrasonics, 2003. vol. 1. IEEE, 2003. (Abstract only).

Touhami, Mustapha, et al. "Piezoelectric materials for the DC-DC converters based on piezoelectric resonators." 2021 IEEE 22nd Workshop on Control and Modelling of Power Electronics (COMPEL). IEEE, 2021.

Braun, Weston D., et al. "Optimized resonators for piezoelectric power conversion." IEEE Open Journal of Power Electronics 2 (2021): 212-224.

Boles, Jessica D., et al. "A piezoelectric-resonator-based dc-dc converter demonstrating 1 kw/cm resonator power density." IEEE Transactions on Power Electronics 38.3 (2022): 2811-2815. (Abstract only).

Wu, Ting, et al. "Spurious-free thickness-shear bulk acoustic resonators on lithium niobate using standard and broadband piston mode designs." Japanese Journal of Applied Physics 61.2 (2022): 025503. (Abstract only).

Nguyen, Kristi, et al. "Near-Spurious-Free Lithium Niobate Resonator for Piezoelectric Power Conversion with $ Q $ of 3500 and k 2 t of 45%." 2022 IEEE International Ultrasonics Symposium (IUS). IEEE, 2022. (Abstract only).

Gong, Songbin, et al. "Microwave acoustic devices: Recent advances and outlook." IEEE Journal of Microwaves 1.2 (2021): 601-609.

Lu, Ruochen, and Songbin Gong. "RF acoustic microsystems based on suspended lithium niobate thin films: Advances and outlook." Journal of Micromechanics and Microengineering 31.11 (2021): 114001. (Abstract only).

Kramer, Jack, et al. "57 GHz acoustic resonator with k 2 of 7.3% and Q of 56 in thin-film lithium niobate." 2022 International Electron Devices Meeting (IEDM). IEEE, 2022.

Segovia-Fernandez, Jeronimo, Nai-Kuei Kuo, and Gianluca Piazza. "Impact of metal electrodes on the figure of merit (k t 2■ Q) and spurious modes of contour mode AIN resonators." 2012 IEEE International Ultrasonics Symposium. IEEE, 2012.

Rinaldi, Matteo, et al. "Super-high-frequency two-port AIN contour-mode resonators for RF applications." IEEE transactions on ultrasonics, ferroelectrics, and frequency control 57.1 (2009): 38-45.

Hagelauer, Amelie, et al. "From microwave acoustic filters to millimeter-wave operation and new applications." IEEE Journal of Microwaves 3.1 (2022): 484-508.

Stenger, V., et al. "Single-sideband thin film lithium niobate (TFLN™) electro-optic modulators for RF over fiber." Optical Fiber Communication Conference. Optica Publishing Group, 2018. (Abstract only).

Pollet, Benjamin, Ghislain Despesse, and François Costa. "A new non-isolated low-power inductorless piezoelectric dc-dc converter." IEEE Transactions on Power Electronics 34.11 (2019): 11002-11013.

Stolt, Eric, et al. "Fixed-frequency control of piezoelectric resonator dc-dc converters for spurious mode avoidance." IEEE Open Journal of Power Electronics 2 (2021): 582-590.

Boles, Jessica D., et al. "Evaluating piezoelectric materials and vibration modes for power conversion." IEEE Transactions on Power Electronics 37.3 (2021): 3374-3390.

Braun, Weston D., Zikang Tong, and Juan Rivas-Davila. "Inductorless soft switching dc-dc converter with an optimized piezoelectric resonator." 2020 IEEE Applied Power Electronics Conference and Exposition (APEC). IEEE, 2020. (Abstract only).

Boles, Jessica D., Joshua J. Piel, and David J. Perreault. "Enumeration and analysis of DC-DC converter implementations based on piezoelectric resonators." IEEE Transactions on Power Electronics 36.1 (2020): 129-145.

Stolt, Eric A., et al. "Piezoelectric resonator second harmonic cancellation in class φ 2 inverters." 2021 IEEE 22nd Workshop on Control and Modelling of Power Electronics (COMPEL). IEEE, 2021. (Abstract only).

Link, A., et al. "Appropriate methods to suppress spurious FBAR modes in volume production." 2006 IEEE MTT-S International Microwave Symposium Digest. IEEE, 2006.

Rosén, Daniel, Johan Bjurstrom, and Ilia Katardjiev. "Suppression of spurious lateral modes in thickness-excited FBAR resonators." IEEE transactions on ultrasonics, ferroelectrics, and frequency control 52.7 (2005): 1189-1192. (Abstract only).

Lee, Jiunn-Horng, et al. "Optimization of frame-like film bulk acoustic resonators for suppression of spurious lateral modes using finite element method." IEEE Ultrasonics Symposium, 2004. vol. 1. IEEE, 2004. (Abstract only).

Wu, Jinbo, et al. "Ultra-wideband MEMS filters using localized thinned 128° Y-cut thin-film lithium niobate." 2023 IEEE 36th International Conference on Micro Electro Mechanical Systems (MEMS). IEEE, 2023. (Abstract only).

Kadota, Micho, Yoshimi Ishii, and Shuji Tanaka. "Ultra-wideband T- and π-type ladder filters using a fundamental shear horizontal mode plate wave in a LiNbO3 plate." Japanese Journal of Applied Physics 58.SG (2019): SGGC10. (Abstract only).

Liu, Kangfu, Yaoqing Lu, and Tao Wu. "7.5 GHz near-zero temperature coefficient of frequency lithium niobate resonator." IEEE Electron Device Letters 44.2 (2022): 305-308. (Abstract only).

Reinhardt, Alexandre, et al. "5 GHz Lamb wave Wi-Fi channel filters." 2022 IEEE International Ultrasonics Symposium (IUS). IEEE, 2022.

Wu, Ziying, et al. "6.2 GHz Lithium Niobate MEMS Filter with FBW of 11.8% and IL of 1.7 dB." 2022 IEEE MTT-S International Conference on Microwave Acoustics and Mechanics (IC-MAM). IEEE, 2022. (Abstract only).

Bousquet, Marie, et al. "Lithium niobate film bulk acoustic wave resonator for sub-6 GHz filters." 2020 IEEE International Ultrasonics Symposium (IUS). IEEE, 2020.

Emad, Ahmed, et al. "Resonant torsional micro-actuators using thin-film lithium niobate." 2019 IEEE 32nd International Conference on Micro Electro Mechanical Systems (MEMS). IEEE, 2019. (Abstract only).

Ono, Masaaki, Masanori Yachi, and Kiyoshi Nakamura. "Third-overtone resonator using thickness longitudinal mode of 36° Y—LiNbO3." Electronics and Communications in Japan (Part II: Electronics) 82.7 (1999): 50-58. (Abstract only).

Catherinot, Lise, et al. "A general procedure for the design of bulk acoustic wave filters." International Journal of RF and Microwave Computer-Aided Engineering 21.5 (2011): 458-465.

Lu, Ruochen, et al. "Thin-film lithium niobate based piezoelectric micromachined ultrasound transducers." 2020 IEEE International Ultrasonics Symposium (IUS). IEEE, 2020. (Abstract only).

Manzaneque, Tomás, et al. "Low-loss and wideband acoustic delay lines." IEEE Transactions on Microwave Theory and Techniques 67.4 (2019): 1379-1391.

Feld, David A., et al. "After 60 years: A new formula for computing quality factor is warranted." 2008 IEEE Ultrasonics Symposium. IEEE, 2008.

Nguyen, Kristi, et al. "Spurious-free lithium niobate bulk acoustic resonator for piezoelectric power conversion." 2023 Joint Conference of the European Frequency and Time Forum and IEEE International Frequency Control Symposium (EFTF/IFCS). IEEE, 2023. (See also Appendix A of underlying US provisional).

Stolt, Eric, et al. "A spurious-free piezoelectric resonator based 3.2

(56)          References Cited

OTHER PUBLICATIONS kW DC-DC converter for EV on-board chargers." IEEE Transactions on Power Electronics 39.2 (2023): 2478-2488.

* cited by examiner

APPARATUSES AND METHODS INVOLVING SUPPRESSION OF SPURIOUS MODES IN RESONATOR-BASED CIRCUITS

BACKGROUND

Aspects of the present disclosure are related generally to the field of resonators, and more particularly to suppression of spurious modes in resonators such as piezoelectric and micromechanical resonators.

It has been appreciated that spurious modes in the response of micromechanical resonators hinders the performance of acoustic filters by generating ripples in the passband and unwanted responses out-of-band. These spurious modes have been characterized as non-harmonic vibration modes and in many instances they are excited via the same electrical/electrode configuration as used to excite the desired mode. For certain types of applications, these vibration modes may pass through related-application circuitry via in-band and/or out-of-band vibrations. Since their resonance frequencies could be very close to the designed mode frequency, spurious modes could negatively affect the normal operation of the resonator.

Additionally, in most micromechanical resonators the ability to set the device impedance by changing its geometry is limited by the appearance of such spurious modes for certain device aspect ratios. Although some methods to suppress out-of-band spurious modes by means of anchoring techniques, or the introduction of dummy electrodes have been implemented, for many applications out-of-band spurious modes and especially in-band spurious modes continue to be problematic. This is true, for example, in connection with high-frequency resonators which employ aluminum nitride, such as in contour mode resonators (CMRs). In such CMRs, in-band spurious modes can be significantly difficult to suppress.

Other emerging applications include various types of acoustic devices. Due to their shorter acoustic wavelength and lower loss, acoustic devices have replaced their radio-frequency (RF) counterparts, and in connection with such acoustic devices using front-end filters and oscillators. In such applications specifically involving piezoelectric power conversion, inductors have been replaced with acoustic resonators in power converters to reduce form factor and improve performance. Piezoelectric power converter circuits can be modeled as a resonator connected to various switch configurations ($S_1, S_2, S_3, S_4$) and direct current (DC) voltage sources ($V_{in}, V_{out}$). For example, FIG. 1 is a schematic of a piezoelectric resonator, modeled by a BVD circuit, integrated into a power converter. The resonator is modeled with an equivalent electrical circuit called the Butterworth-Van Dyke (BVD) circuit that consists of a series motional inductor, resistor, and capacitor ($L_m$, $R_m$, $C_m$) connected in parallel with a static capacitance ($C_0$). The converter's operation range is restricted by the resonator's inductive behavior (between series and parallel resonances). Although the converter is excited with DC voltages, zero-voltage switching sequences are leveraged to induce a motional current within the resonator at the circuit's operating frequency. By tuning the switches' timings, the operating frequency can be varied, which ultimately determines the converter's output power for a given voltage conversion ratio. These switching sequences comprise connected, open, and zero stages that soft-charge the resonator's static capacitance $C_0$ and minimize switching losses. Maximum power output occurs near series resonance, and as the operating frequency increases, output power decreases and converter efficiency increases. In this context, piezoelectric power conversion can be implemented to utilize the piezoelectric resonator as the converter's primary or sole energy storage element.

Although the working principle is well accepted for previously-reported piezoelectric power converters, their performance is limited by the integrated resonator, specifically by moderate quality factor (Q), electromechanical coupling ($k^2$), and spurious modes near resonance. For example, lower $Q \cdot k^2$ is known to reduce converter efficiency, while spurious modes between series and parallel resonances limit the converter's operating range.

In particular, for resonator designs such as the above-characterized types, spurious modes tend to spread out and/or the designs prove to be difficult to implement at frequencies on the order of 1 MHz (e.g., nearing or exceeding 1 megahertz).

These and other matters have presented challenges to efficiencies which benefit from suppression of spurious modes in resonators for a variety of applications.

SUMMARY OF VARIOUS ASPECTS AND EXAMPLES

Various examples/embodiments presented by the present disclosure are directed to issues such as those addressed above and/or others which may become apparent from the following disclosure, and particularly for applications involving methods and/or devices that benefit from suppression of spurious modes generated by use of a piezoelectric-type resonator. Such method and devices include, but are not limited to, those involving power conversion such as characterized herein and whether or not corresponding to equivalent circuit of FIG. 1.

In exemplary non-limiting contexts, example aspects of the present disclosure are directed to circuit-based apparatuses (e.g., devices and/or systems) which may include a band-type electrode design (e.g., a ring-based electrode design) with the band being conductive for suppressing spurious modes during operation of piezoelectric resonators. In specific applications related to such exemplary aspects, such circuit-based apparatuses may be used to address a variety of technical issues ensuing from such spurious modes and/or secondary resonances associated with related components (e.g., in a bulk acoustic material), and other issues which may disrupt efficient operation of certain circuitry and worsen performance of the related circuitry.

In certain examples, methods and apparatus are directed to a resonator-based circuit which, in operation, has an electrically-conductive band ("band") at least partially surrounding a center electrode which includes the piezoelectric material of the circuit's resonator. In particular examples, the band acts to electrically load vibrations near resonance and consequently, spurious mode suppression is realized. In more particular example embodiments, the band maintains TE (transverse electric) mode while eliminating lateral spurious tones, and in one application-specific example, the resonator-based circuitry and the electrical-conductive band facilitate piezoelectric power conversion.

In certain more-specific examples, aspects of the present disclosure involve a conductive (e.g., metallized) section of a band such as a ring, separated (concentrically) from an active electrode of the piezoelectric resonator by a thin gap, wherein boundary conditions for supporting spurious lateral modes are changed such that these modes experience zero coupling coefficient and are not supported.

In particular examples of methods of the present disclosure, such methods may involve one or more of the above aspects in implementations and/or applications involving any of a variety of contexts including, for example, in power electronics, in (the emerging field of) piezoelectric power converters, and for various types of filters (e.g., acoustic filters as used in and for telecommunications, RF filters, etc.). One particular example method is for use with a resonator-based circuitry including a resonator with a center electrode, and the method comprises: operating the resonator-based circuitry at a resonance frequency on the order of 1 MHz with an electrical-conductive band having a contiguously curved region at least predominantly surrounding one or more center electrodes of the resonator-based circuitry; and using the electrical-conductive band, while operating the resonator-based circuitry at the resonance frequency, to suppress one or more spurious modes at least in part by electrically loading piezoelectric material of the resonator.

In certain examples, a piezoelectric-based resonator apparatus includes, as above, a piezoelectric resonator having at least one center electrode, and a band, having an electrically-conductive contiguous region at least predominantly surrounding the at least one center electrode, to mitigate one or more spurious modes during operation of the apparatus at least in part by electrically loading piezoelectric material in the piezoelectric resonator, and further includes signal-processing circuitry, coupled to the piezoelectric resonator, to drive an application-specific circuit. The signal-processing circuitry, the piezoelectric resonator and the band cooperatively operate to facilitate performance of the application-specific circuit (e.g., as part of the apparatus), without adversely affecting operation of the application-specific circuit.

In yet more specific aspects, the above-characterized semiconductor structure is directed to a band-type resonator design, consistent with one or more of the example of the present disclosure, that features electromechanically coupling ($k^2$) of at least 25% (e.g., 30% or higher) and with a spurious-suppressed region of at least 0.50 MHz (e.g., in a range from 0.50-0.72 MHz, from 0.50-0.75 MHz, or 0.50-1.00 MHz). and a fractional suppressed region of at least 50% (e.g., in a range from 50%-75%), and with spurious-mode suppression over various ranges of frequencies and with wider spurious suppression expanding the converter's output powers.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description and in connection with the accompanying drawings, each in accordance with the present disclosure, in which:

FIGS. 4A and 4C are respective graphs showing simulated impedance (Z) and resistance (R) of a reference device (FIG. 4A) and an example implementation (FIG. 4B), according to the present disclosure;

FIGS. 4B and 4D are perspective views, respectively showing displacement of the reference device of FIG. 4A and showing displacement of the implementation of FIG. 4C;

Figure 1:
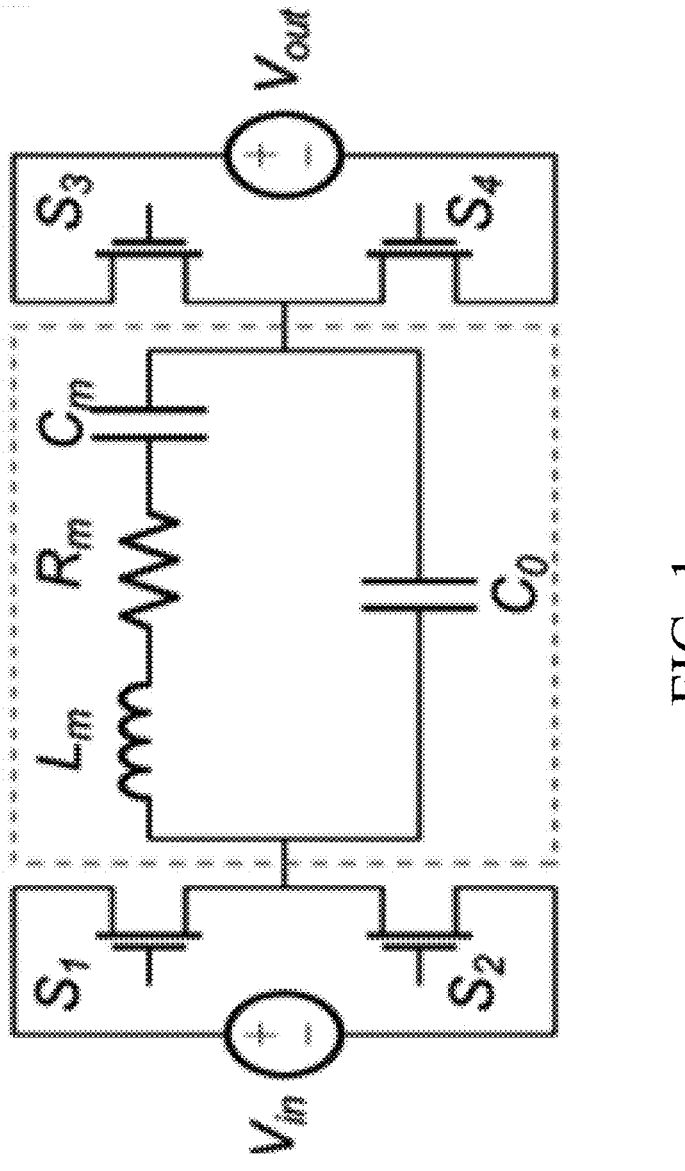
FIG. 1 is a circuit schematic of a piezoelectric resonator, modeled by a BVD circuit, and integrated into a power converter, consistent with one example according to certain exemplary aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving circuit-related structures, and materials and functions associated with one or more resonators used with piezoelectric designs. While discussion herein, and including Appendix A of the underlying U.S. provisional application, may refer to piezoelectric power conversion, such discussion is for providing merely an exemplary context to help explain such aspects, and the present disclosure is not necessarily so limited. For instance, resonator designs according to the present disclosure are applicable not only to piezoelectric power conversion, but also to many applications requiring high figure of merit (FoM) and no spurious modes, such as filters, oscillators, and transformers. The examples and specific applications discussed herein, in connection with the figures, and in Appendix A, may be implemented in connection with one or more aspects, examples (or example embodiments) and/or implementations, whether such aspects are considered alone or in combination with one another.

In certain examples, a piezoelectric-based resonator apparatus includes, as above, a piezoelectric resonator having at least one center electrode, and a band, having an electrically-conductive contiguous region at least predominantly surrounding the at least one center electrode, to mitigate one or more spurious modes during operation of the apparatus at least in part by electrically loading piezoelectric material in the piezoelectric resonator, and further includes signal-processing circuitry, coupled to the piezoelectric resonator, to drive an application-specific circuit. The signal-processing circuitry, the piezoelectric resonator and the band cooperatively operate to facilitate performance of the application-specific circuit (e.g., as part of the apparatus), without adversely affecting operation of the application-specific circuit and while the piezoelectric resonator operates at a resonance frequency on the order of 1 MHz. In more specific examples of this kind, the application-specific circuit can include at least one of: piezo-electric power conversion circuitry, RF (radio frequency) filter circuitry; one or more oscillators, and one or more transformers.

Accordingly, in the following description various specific details are set forth to describe specific examples presented herein. It should be apparent to one skilled in the art, however, that one or more other examples and/or variations of these examples may be practiced without all the specific details given below. In other instances, well-known features have not been described in detail so as not to obscure the description of the examples herein. For case of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Consistent with various aspects discussed herein, such resonator-based devices and methods (of manufacture/use) may involve aspects presented and claimed in U.S. Provisional Application Ser. No. 63/459,462 filed on Apr. 14, 2023 (STFD.451P1 S23-006), to which priority is claimed. The subject matter disclosed in this U.S. Provisional Application is incorporated by reference in its entirety generally and to the extent that further aspects and examples (such as experimental and/more-detailed embodiments) may be useful to supplement and/or clarify.

Exemplary aspects of the present disclosure are related to methods or apparatuses (e.g., systems, components and/or circuits) in which a resonator-based circuitry is used with an electrical-conductive band ("band"). The resonator-based circuitry includes a resonator with a center electrode, and the band has an elongated contiguous region (e.g., with a certain thickness along a horizontal plane) that at least primarily surrounds the center electrode, to suppress one or more spurious modes at least in part by electrically loading, during operation of the apparatus, piezoelectric material of the resonator. In certain more-specific examples, the band's elongated contiguous region entirely surrounds the center electrode and in other more-specific examples, the band's elongated contiguous region sufficiently surrounds (e.g., most of or all of) the center electrode so as to account for at least a majority of a perimeter around the center electrode. It should be appreciated that the sufficiently-surrounded center electrode may be from among multiple center electrodes that are surrounded as such.

It should also be appreciated that between the band's elongated contiguous region and the design of the resonator, the apparatus may be designed to have one or more characteristics for enhancing a particular application. For instance, exemplary material-based characteristics may pertain to a degree of desired performance for a given application. For example, in certain example implementations according to the present disclosure, the piezoelectric material in the resonator includes Lithium and/or Niobate.

For one specific exemplary implementation according to the present disclosure, piezoelectric materials for a resonator used in a piezoelectric power conversion circuit are particularly selected to optimize one or more performance aspects (e.g., switching or operating frequency ($f_s$), moderate electromechanical coupling ($kt^2$), quality factor (Q), FoM, region of spurious-mode suppression (e.g., MHz), and fractional suppression region). For this particular type of implementation as applied in a lithium niobate bulk acoustic resonator, the selected material corresponds to or at least predominantly includes a combination of Lithium and Niobate (e.g., $LiNbO_3$). The spurious-suppressed region corresponds to the frequency range where resistance is no larger than $20 \times R_m$ (the frequency range where resistance is no larger than $20 \times R_m$ (minimum resistance)), and the fractional suppressed region is the ratio of the spurious-suppressed region to the difference between series and parallel resonance frequencies. These metrics aim to characterize spurious suppression over a range of frequencies with wider spurious suppression expanding the converter's output powers.

Other characteristics may concern design size and/or limitations in terms of component dimensions (see, e.g., exemplary dimensions in Table 1 which follows), conductivity of the band (e.g., varying degrees of conductivity), and shape of the band (e.g., rounded, oval, curved, neither round nor oval, without any acute and/or obtusely-angled turns or corners). In connection with such characteristics, the band may be optimized for performance as a rounded or oval shape and with the band being connected to a certain (reference) terminal for providing an effective loading along the perimeter of the shape which at least primarily surrounds the center electrode. In specific examples of a resonator-based circuit, the electrical loading is to reinforce TE coupling and/or to leverage an isotropic piezoelectric coefficient (e.g., $e_{33}$) while suppressing an isotropic piezoelectric coefficient (e.g., $e_{31}$ in 36Y-cut $LiNbO_3$), and the band may have at least one non-conductive gap along the elongated portion with one or multiple (e.g., two-opposing) sides of the conductive portion(s) of the band being connected to a reference node. Depending on the desired effect, the reference terminal may be circuit ground or common for the circuit and in other examples, the reference terminal may be a node connected to a power rail of the circuit.

In related specific examples of the present disclosure, the resonator may have a resonance frequency on the order of 1 MHz (e.g., 0.5 MHz or greater) with the band configured relative to the resonator for preventing (or at least noticeably mitigating) any spurious mode(s) being spread out or otherwise degrading a FoM associated with the apparatus by more than about ten percent (e.g., while maintaining a high FoM of at least 1000). In this manner, the band mitigates one or more spurious modes, caused by operation of the resonator-based circuitry, by sufficiently suppressing the one or more spurious modes during the operation of the apparatus, such that if each spurious mode were not suppressed, the one or more spurious modes would noticeably degrade performance of the apparatus.

Figures 2A, 2B:
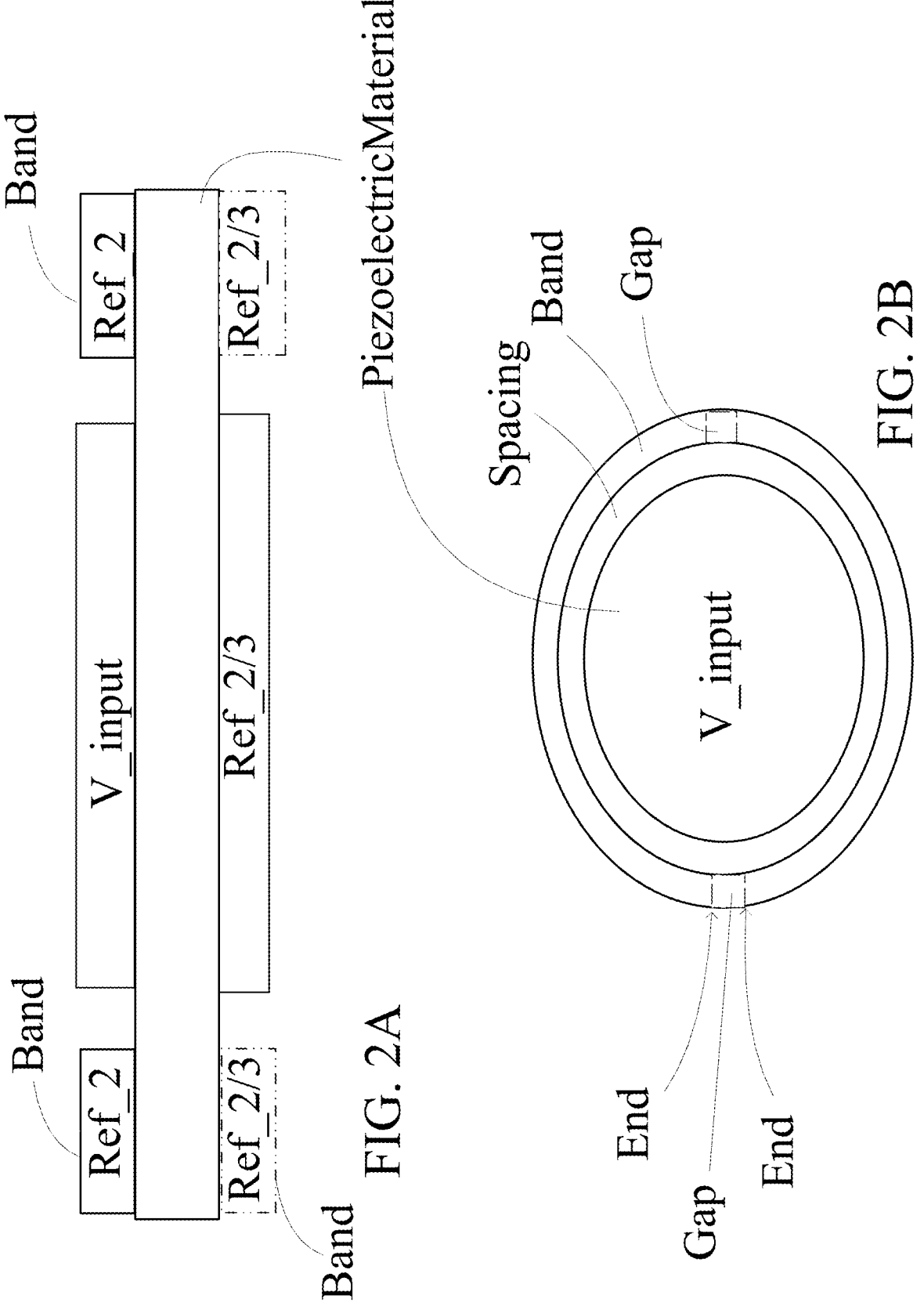
FIGS. 2A and 2B respectively depict a side (or cross-sectional) view and a top-down view of a resonator design, according to certain exemplary aspects of the present disclosure.

Particular experimental examples, according to the present disclosure and corresponding to the above aspects for a power-converter (such as modeled by the schematic diagram of FIG. 1), a piezoelectric material is specially selected to provide intrinsic high-electromechanical-coupling and low-loss material properties. In certain of these examples, $LiNbO_3$ is used as the selected material. Combining such material properties with a rounded- or circular shape (metal) ( ) was found to yield surprising performance aspects which evidence significant improvement over previously-reported piezoelectric power converter resonators. In certain of these experimental examples, these performance aspects include:

the switching or operating frequency ($f_s$) at 10.14 MHz, moderate electromechanical coupling ($kt^2$) at 30 percent, a quality factor (Q) of 4000, a high FOM of 1200, region of spurious-mode suppression at 0.72 MHz), and fractional suppression region at 62 percent. Using these latter two suppression-related aspects and while manifesting a high FOM and/or moderate Q·$k^2$, at 0.72 MHz the region of spurious-mode suppression is about twice the best reported value (0.27 MHz) among the previously-reported piezoelectric power converter resonators, and at 62 percent the fractional suppression region is about twice the best reported value (42.9 MHz) among the previously-reported piezoelectric power converter resonators. Moreover, relative to such previous reports and based on further measurements, this type of resonator provide a smoother and more constant Q over a broader frequency range, indicating a completely spurious-free performance. FIGS. 2A-2B depict a type of resonator design having a surrounding conductive band according to the present disclosure. FIG. 2A depicts a side (or cross-sectional) view of such a resonator design and FIG. 2B depicts a top-down view of the resonator design. It has been discovered that the surrounding conductive band acts to realize spurious mode suppression, for example, by increasing coupling of the TE mode, inducing uniform vibration, and/or maintaining TE mode while eliminating lateral spurious tones.

As best shown in FIG. 2A, the piezoelectric material of this example resonator is located under (or immediately adjacent) a terminal (V_input) for presenting an input voltage to the resonator. The conductive band at least partially surrounds the piezoelectric material at one side (e.g., top side) and optionally on the opposing side of the resonator. For realizing spurious mode suppression, the band is connected to a reference terminal such as common, ground, or a power rail (e.g., a negative voltage source such as in designs where ground is not used).

In certain examples, methods and apparatus are directed to a resonator-based circuit which, in operation, has an electrically-conductive band ("band") at least partially surrounding a center electrode which includes the piezoelectric material of the circuit's resonator. In particular examples, the band acts to electrically load vibrations near resonance and consequently, spurious mode suppression is realized. In alternative example embodiments, the design and band (or a contiguous portion of the band) can be shaped circular, oval, etc. Also, in specific examples and as depicted by one or both gaps in FIG. 2B, the band need not extend all the way around the piezoelectric material but rather the band may predominantly surround the piezoelectric material (on at least on one side) with at least one contiguous portion of the band having ends as shown at the left and rights sides of the structure of FIG. 2B.

For such examples, FIG. 2A shows the band being connected to a reference terminal which is depicted on the top side by "Ref_2" and, in instances where the option of having an opposing-side band (e.g., as separate bands or as a single band with a gap), this same reference terminal (Ref_2) may be used or another reference terminal (Ref_3, different from Ref_2) may be used. In each case, each of Ref_2 and Ref_3 generically represent one of common, ground, a power rail, etc. so as to realized (contribute to) the desired loading for spurious mode suppression. Consistent with the BVD circuit modeled in FIG. 1, FIG. 2A has the side (bottom) opposite the input signal being grounded or otherwise connected to sink current to the appropriate reference terminal (e.g., Ref_2 or Ref_3). Among such examples and also with reference to FIG. 2A, one example may use a conductive band on the top side and a separate conductive band on the bottom side, with these bands being connected to Ref_2, connected to Ref_3, or with one band connected to Ref_2 and the other band connected to Ref_3.

Figures 3A, 3B:
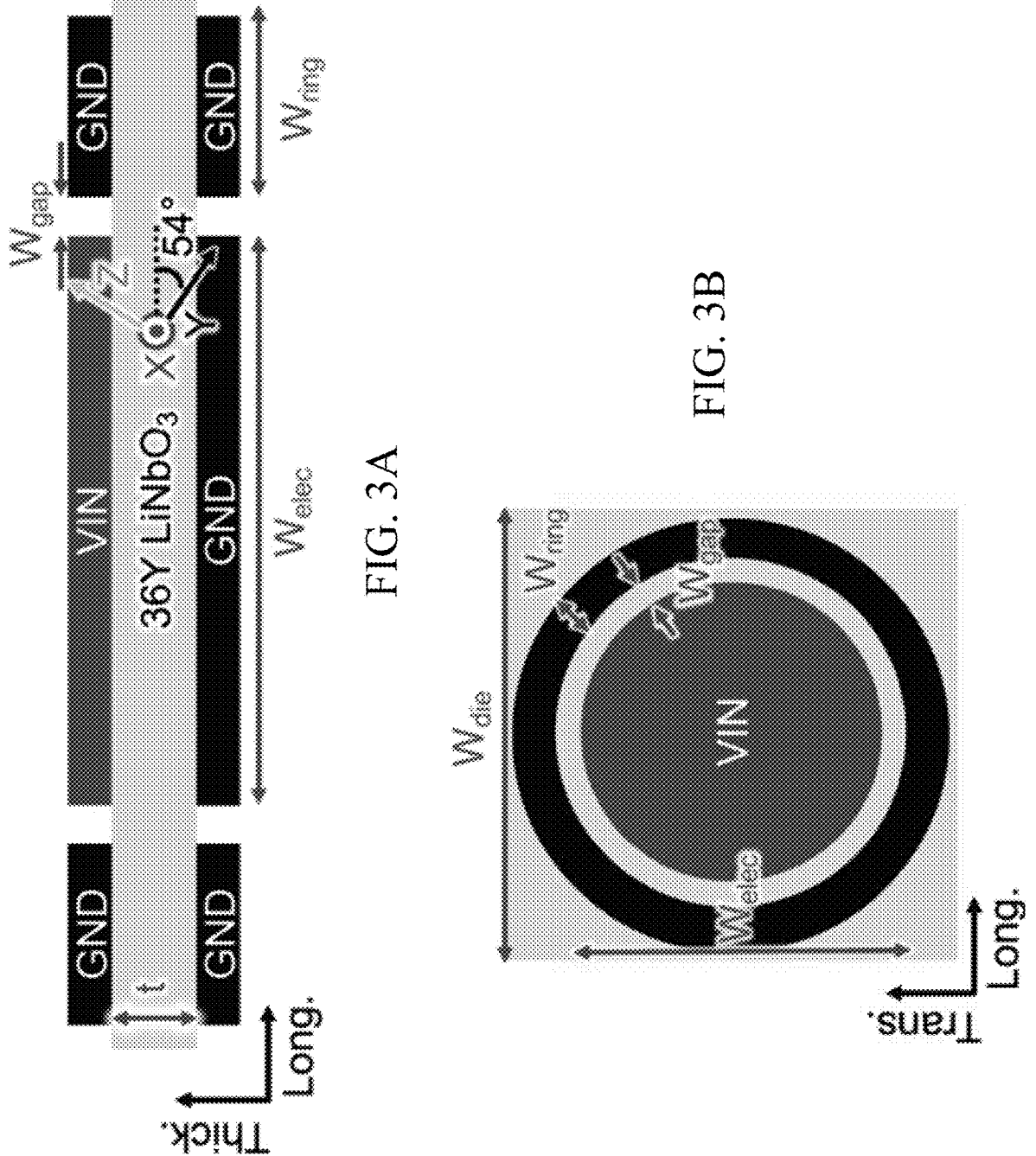
FIGS. 3A-3B respectively depict a side (or cross-sectional) view and a top-down view of another resonator design, according to certain exemplary aspects of the present disclosure.

As a more specific example type of such resonator design, FIGS. 3A-3B provide respective views of another resonator design which is also in accordance with the present disclosure and consistent with aspects of the resonator design disclosed in connection with FIGS. 2A and 2B. FIG. 3A a side or cross-sectional view of a resonator design, and FIG. 3B a top-down view of the resonator design of FIG. 3A, and FIGS. 3A-3B depict one example configuration (generally represented by FIGS. 2A-2B) in which the bottom-side, opposite the input signal (Vin), has center and ring-shaped lower band portions grounded or otherwise connected to sink current to the appropriate reference terminal. The top-side, to the left and right of the terminal for the input signal (Vin), has ring-shaped upper band portions grounded or otherwise connected to sink current to the appropriate reference terminal.

For effecting optimal spurious suppression, the band may be implemented as a grounded conductive round ring-like structure (e.g., FIGS. 3A-3B), but alternative implementations (shape, material selection, etc.) may also facilitate adequate or even optimal spurious suppression for certain design specifications. In the example types of FIGS. 3A-3B, the resonator features center electrodes, on the top and bottom, that are electrically excited in opposing configurations. These electrodes are further surrounded by a non-metallized separation gap, which are then surrounded by the band (a metallized ring) that is electrically grounded on top and bottom portions on opposing sides of a non-metallic gap, for spurious suppression.

The dimensions of the grounded ring-shaped band (sometimes "ring") and separation gap may be optimized via parametric sweep. In connection with the present disclosure, it has been discovered that a smaller separation gap generally improves performance but poses potential challenges with power handling, while a larger ring width improves performance yet saturates after a certain threshold is reached.

In principle, the separation gap generated by the grounded ring not only maintains the TE mode, but also eliminates lateral spurious tones. In contrast to expected results in which a recessed frame in a certain structure removes lateral modes by altering the dispersion characteristics, careful implementation of a circular reference TE design according to the present disclosure uses a grounded ring for spurious-free operation by electrically loading the piezoelectric material such that it can reinforce the TE coupling. In conjunction with this reinforced TE coupling feature, the circular shape leverages the isotropic piezoelectric coefficient $e_{33}$ while suppressing the anisotropic $e_{31}$ in the piezoelectric material (e.g., $LiNbO_3$).

In one such example implementation of the type of resonator design shown in FIGS. 3A-3B (with the ring-shaped band being grounded), measured parameters are as follows: thickness "t" of the $LiNO_3$ (piezoelectric material) is 0.3 mm; the width ("Wgap") of the gap in the band ("$W_{gap}$") is 80 μm; the width of the ring-shaped band ("Wring") is 2 mm; the width of the electrode ("Welec"), located on the bottom side of FIG. 3A opposite the Vin electrode, is 14 mm; and the die width ("Wdie" as in FIG. 3B) is 18 mm.

Each of the electrodes in the specific example of FIG. 3A includes aluminum (Al) and has a thickness of 300 nm. From the top-view (FIG. 3B), it can be seen that each of the center electrode, non-metallized separation gap, and ring-shaped band (upper and lower band portions) are circularly-shaped. In one implementation of the design of FIGS. 3A and 3B: lithography is performed on 4-inch 0.3 mm thick 36Y-cut LiNbO₃, to form the electrode and ring patterns; 300 nm of aluminum (Al) is then deposited on both sides of structure (e.g., via an e-beam evaporator); the wafer thickness is chosen based on the frequency specifications set by the desired power converter operation; and a clearly-defined non-metallized gap separates the electrode from the ring-shaped band; and then the wafer is diced and the individual resonator is epoxied at the corners and wire bonded to the testbed. The resonator itself (formed in this way) is 18×18 mm² in size, the entire mounted device has an area of 28×28 mm², and metal (e.g., copper) traces can be used for routing to a connector for measurements.

Figure 3C:
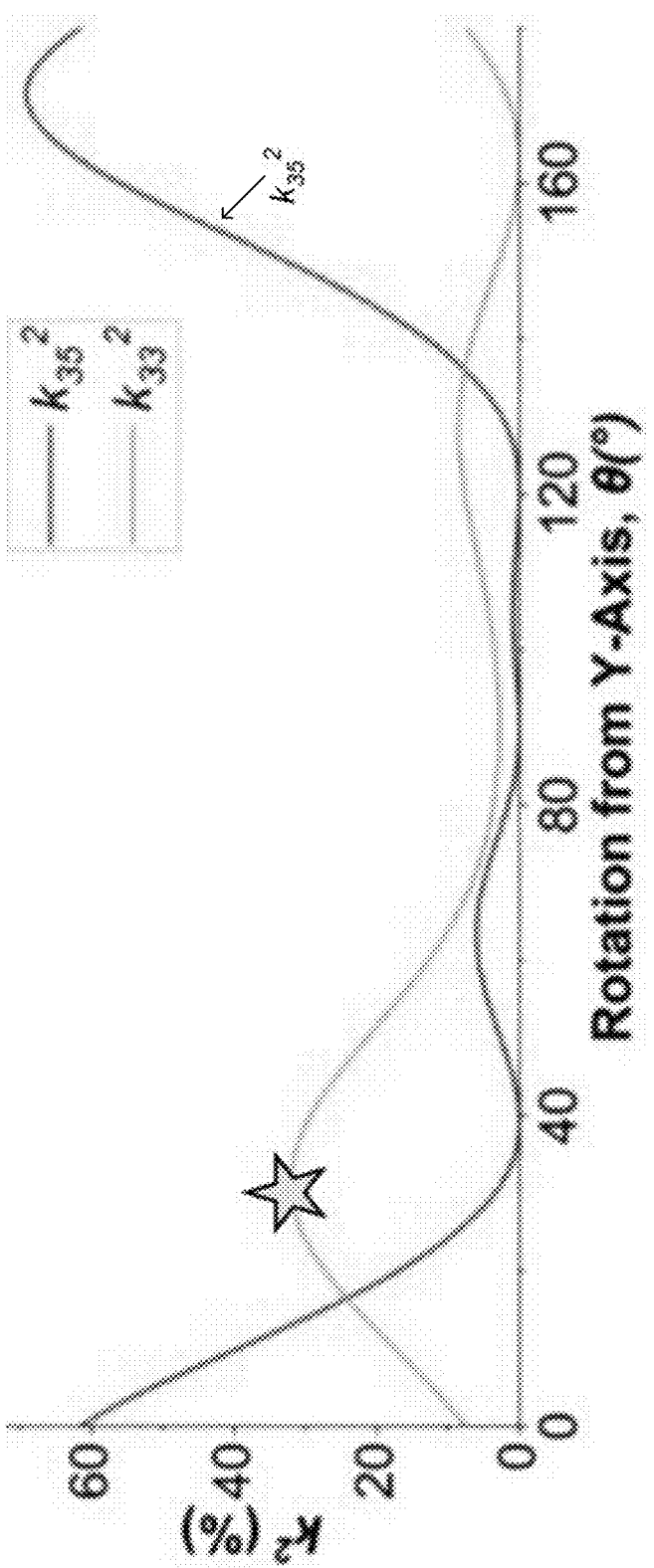
FIG. 3C is a graph showing coupling coefficient, $k^2$ (Y axis) as the rotation from the y-axis varies, for a specific exemplary implementation according to the present disclosure.

FIG. 3C is a graph for the specific exemplary design of FIGS. 3A and 3B, and is useful for showing coupling coefficient, $k^2$ (Y axis) as the rotation from the y-axis varies for TS mode ($k^2$) and TE mode ($k^2$). For this specific example implementation, LiNbO (or LiNbO₃) was selected as an example for the piezoelectric material due to its intrinsic high electromechanical-coupling and low-loss material properties. As marked by the star, the graph shows the electromechanical-coupling to be at about 30% with appropriate rotation at the y-axis. However, selecting the orientation and direction of the applied electric field is challenging as LiNbO₃ is highly anisotropic. The goal is to choose a crystal orientation that increases coupling of the TE mode to induce uniform vibration, thus increasing Q and minimizing parasitic couplings. FIG. 3C plots $k^2$ as a function of the rotated Y-axis, namely $k^2(e^2/c/\varepsilon)$ for TE and $k^2(e^2/c/\varepsilon)$ for thickness shear (TS). To optimize TE coupling while minimizing other modes, 36Y-cut LiNbO₃ was selected as a commercially viable option. Due to its unique dispersion behavior, 36Y-cut LiNbO₃ is an optimal choice for confining energy of the TE mode and to maximize the TE mode.

Figures 4A, 4B, 4C, 4D:
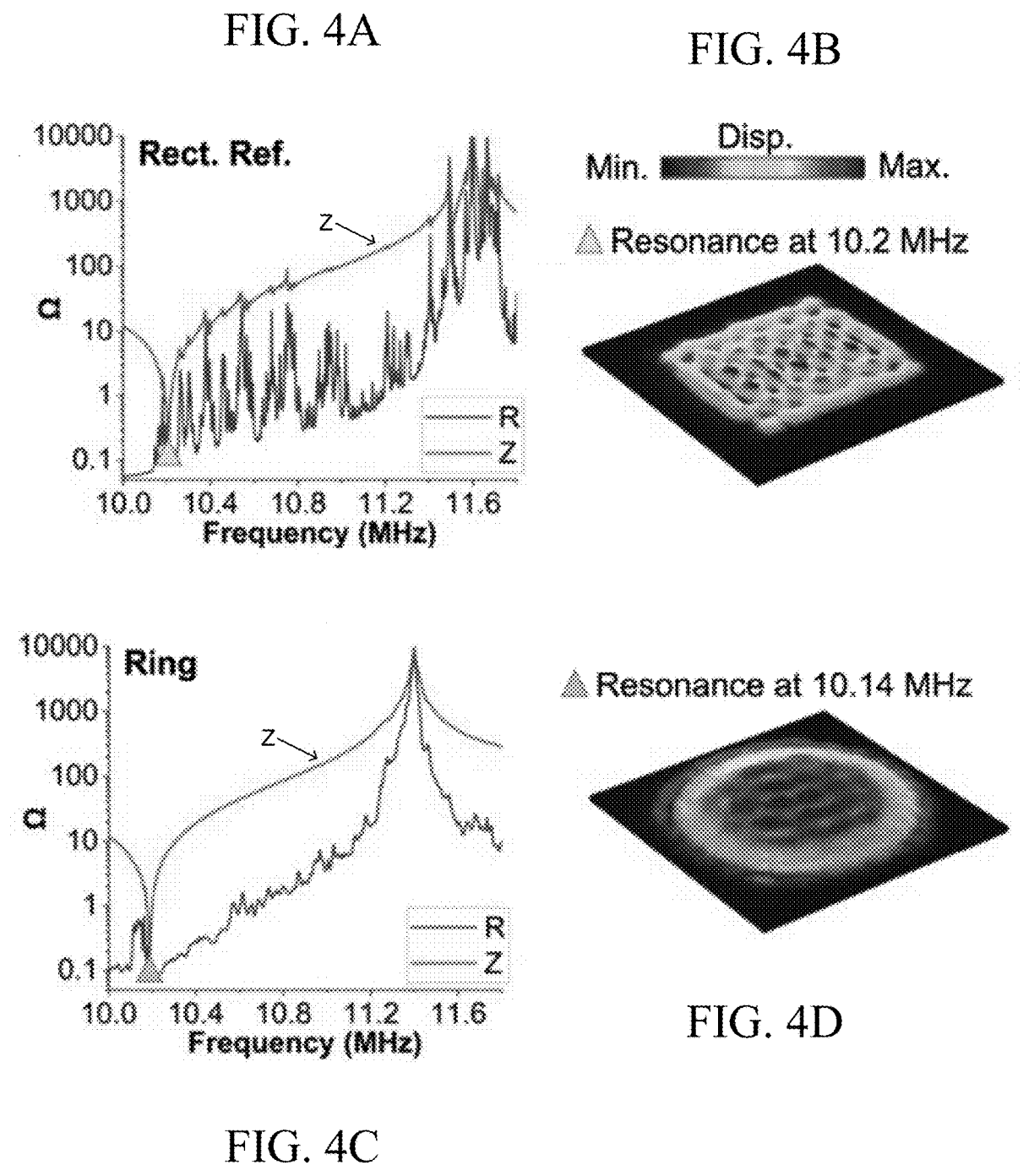

For comparison, experimental efforts in connection with the present disclosure accounted for simulated reference designs using a first simulated reference design with a rectangular TE design (e.g., with rectangular electrodes centered on the top and bottom of LiNbO₃) with performance metrics as depicted in FIG. 4A, and a second simulated design which is a circular reference TE design having a ground circular band as in FIGS. 3A-3B and with performance metrics as depicted in FIG. 4B.

The graphs of FIGS. 4A and 4C show simulated impedance (Z) and resistance (R) respectively for the reference device of FIG. 4A and for the design of FIGS. 3A-3B (corresponding to the graph of FIG. 4C). In contrast to the preferred performance metrics discussed herein in connection with the circular reference TE design of the type(s) in FIGS. 3A-3B, for the first simulated reference associated with FIGS. 4A-4B, impedance and resistance reveal large spurious modes in the inductive region of the resonator. These large spurious modes virtually render use in a piezo-electric-power-conversion application as being useless. Further, the displacement mode shape (FIG. B) reveals multiple modes at resonance, indicating non-uniform vibration, whereas displacements at resonance for the example design implementation of FIGS. 3A-3B (associated with the displacement mode shape of FIG. 4D vibrate with significantly more uniformity and greater amplitude than with the reference device associated with f FIG. 4A. Also, this uniformity and greater amplitude manifests with little-to-no lateral mode shapes detected. Accordingly, such exemplary resonator designs according to the present disclosure improve performance metrics for TE designs by adding such a grounded curved or circular band, and with impedance and resistance being completely spurious-free, thus increasing the spurious-suppressed region for increased converter operation range.

Figures 5A, 5B:
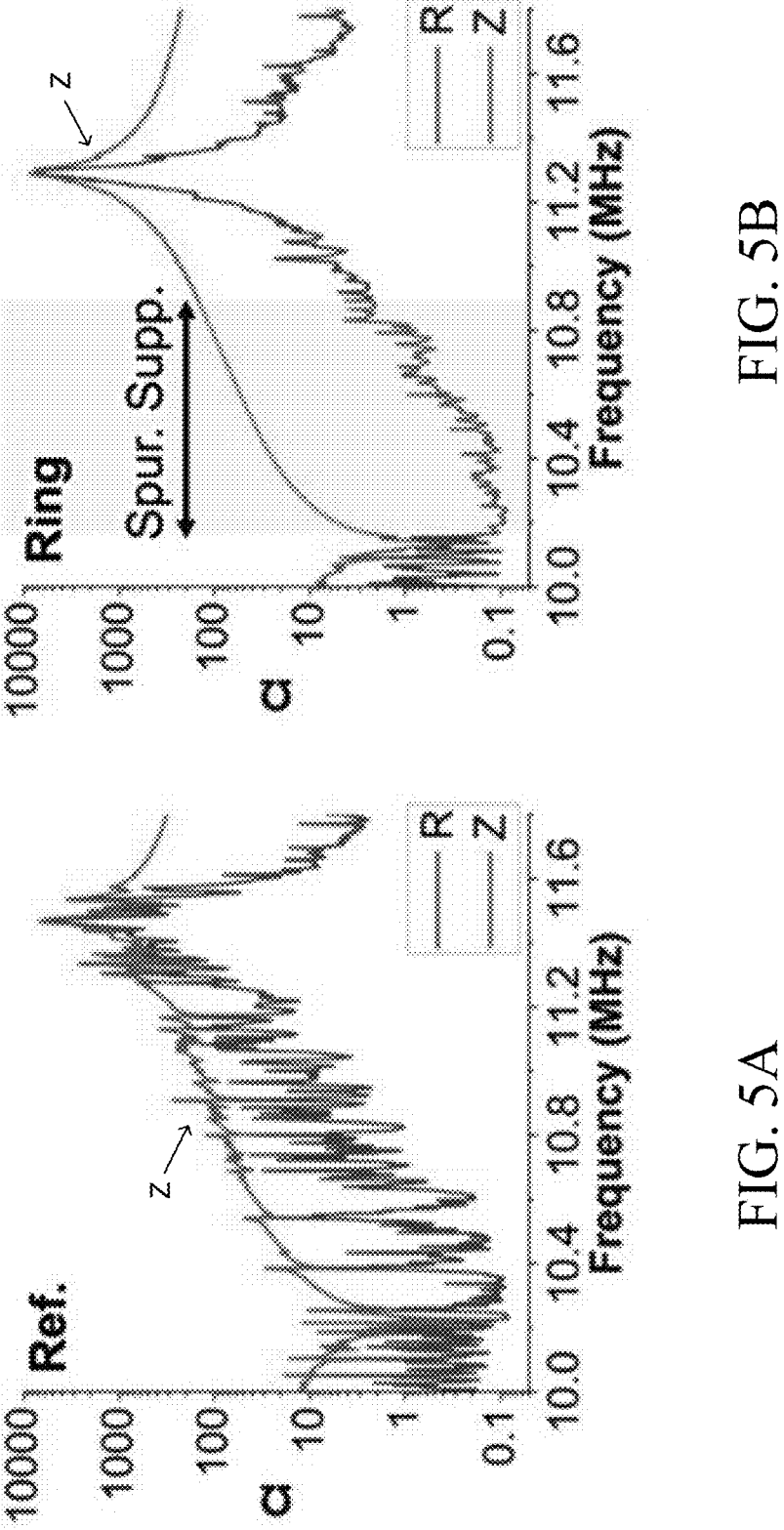
FIGS. 5A and 5C are graphs respective showing measured impedance/resistance (FIG. 5A) and showing Bode Q smoothness (FIG. 5C) for a reference device.
FIGS. 5B and 5D are respective graphs showing measured impedance (e.g., resistance) and Bode Q for an example implementation of the present disclosure.
Figures 5C, 5D:
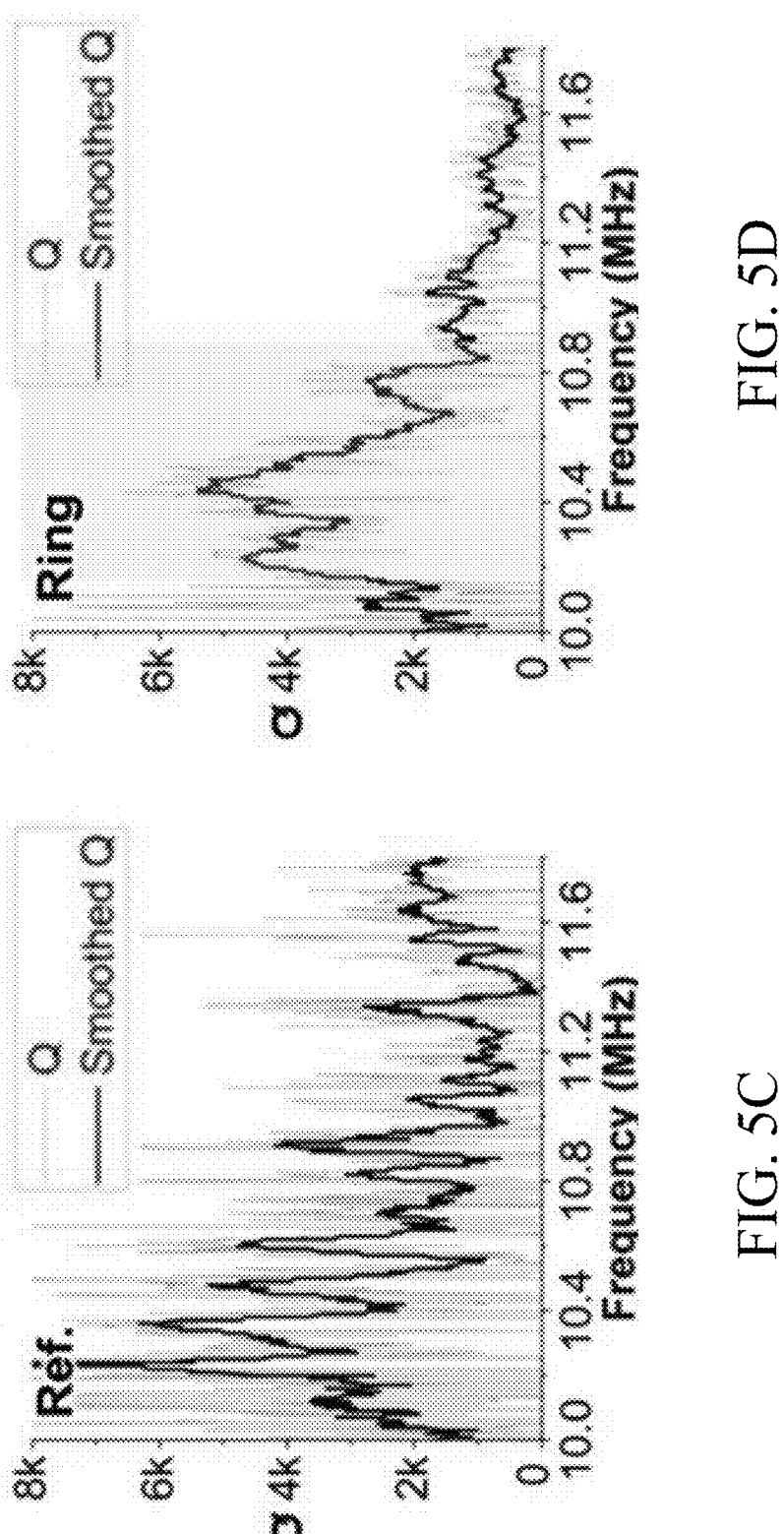

The measured impedance, resistance, and Bode Q of the rectangular reference and of the designs according to the present disclosure are compared in FIGS. 5A-5D. FIGS. 5A and 5C are graphs showing measured impedance/resistance and Bode Q for a reference device, whereas FIGS. 5B and 5D are graphs showing measured impedance (e.g., resistance) and Bode Q for an example band-type device implemented according to the present disclosure. The rectangular reference design associated with the graph of FIG. 5A features the previously-discussed rectangular reference design as that in FIG. 4A. For the band-type device, FIG. 5B shows measured results having huge spurious modes that are greatly suppressed, with the remaining spurious modes likely caused by wafer thickness variations. Both fabricated devices demonstrate Bode Q around 4000 (as in FIGS. 5C-5D). Since Bode Q depends on group delay, it is extremely sensitive to spurious modes. The reference design of FIG. 5C yields an inconsistent value of Q as the frequency varies. In contrast, the band-type design of FIG. 5D yields measurements indicating a smoother and more constant Q over a broader frequency range, suggesting a completely spurious-free performance.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices, and examples as described hereinabove may also be found in the Appendix of the above-referenced U.S. Provisional Application.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions. Also, in connection with such descriptions, the term "source" may refer to source and/or drain interchangeably in the case of a transistor structure. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner. Further, unless otherwise indicated ranges (of any, and all metrics) are merely exemplary of "approximate ranges" wherein this term may be understood to vary the bound(s) of the range (e.g., using improved and/or degraded material- or circuit-based design parameters) by a degree of anywhere from 10-to-20 percent (or in some instances) from 5-25 percent, and, in the context of comparison to an improvement over a previously-reported effort, or general use of terms such as "approximate" or "about", by a degree of improvement of 10 percent, or 20 percent or greater (e.g., depending on the context, equipment being used to assess, and application requirements for a particular design).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. An apparatus comprising:
   resonator-based circuitry including a resonator having a center electrode; and
   an electrical-conductive band ("band"), having an elongated contiguous region at least primarily surrounding the center electrode and having a width dimension that is smaller than a gap dimension defining a non-metalized separation between the band and the center electrode, to maintain TE mode and to suppress one or more spurious modes at least in part by electrically loading, during operation of the apparatus, piezoelectric material of the resonator.

2. The apparatus of claim 1, wherein the band is to suppress one or more spurious modes by providing substantially spurious-free operation of the apparatus, at a resonance frequency on the order of 1 MHz, without spreading out the one or more spurious mode or degrading a FoM (figure of merit) associated with the apparatus, and wherein the resonator has one or more center electrodes, including the center electrode, with the band being contiguously curved throughout the elongated contiguous region.

3. The apparatus of claim 1, wherein the band is to mitigate one or more spurious modes, caused by operation of the resonator-based circuitry, by sufficiently suppressing the one or more spurious modes during the operation of the apparatus, that if not suppressed the one or more spurious modes would degrade performance of the apparatus, and the gap dimension is smaller than the width dimension of the band by at least an order of magnitude, and wherein a crystal orientation of the resonator, the width dimension and the gap dimension are set to facilitate the TE mode being maintained or enhanced, while eliminating lateral spurious tones, to induce uniform vibration of the resonator.

4. The apparatus of claim 1, wherein the resonator is a piezoelectric-type resonator having a certain crystal orientation, the band has a shape that is round or oval, and the band and the certain crystal orientation are to increase coupling of the TE mode to induce uniform vibration of the resonator.

5. The apparatus of claim 1, wherein the band bears an irregular shape that is neither a round shape nor an oval shape, and a certain crystal orientation of the resonator and the band are to increase coupling of the TE mode to induce uniform vibration of the resonator.

6. The apparatus of claim 1, wherein the band is to provide an effective electrically loading along a perimeter that at least primarily surrounds the center electrode without any corners formed in the band, and each of the center electrode and the band has a common thickness.

7. The apparatus of claim 1, wherein the band is to provide a contiguous conductive perimeter that surrounds the center electrode entirely and that is
   without any corners formed in the band, and
   characterized as being without terminating ends.

8. The apparatus of claim 1, wherein the band has terminating ends, does not have any corners formed in the band, and is to provide a conductive perimeter primarily surrounding the center electrode.

9. The apparatus of claim 1, wherein the resonator included in the resonator-based circuitry is a piezoelectric acoustic resonator having at least one of Lithium and Niobate.

10. The apparatus of claim 1, wherein the one or more spurious modes are suppressed consistent with a spurious-suppressed region in a range from 0.50 MHz to 0.75 MHz.

11. An apparatus comprising:
   a piezoelectric resonator having at least one center electrode;
   signal-processing circuitry, coupled to the piezoelectric resonator, to drive an application-specific circuit; and
   a band, having an electrically-conductive contiguous region at least predominantly surrounding the at least one center electrode and having a width dimension that is smaller than a gap dimension defining a non-metalized separation between the band and the at least one center electrode, to maintain TE mode and to mitigate one or more spurious modes during operation of the apparatus at least in part by electrically loading piezoelectric material in the piezoelectric resonator.

12. The apparatus of claim 11, wherein the piezoelectric resonator is an acoustic resonator having at least one of Lithium and Niobate.

13. The apparatus of claim 11, wherein the signal-processing circuitry, the piezoelectric resonator and the band are to cooperatively operate to facilitate performance of the application-specific circuit, included as part of the apparatus, without adversely affecting operation of the application-specific circuit while the piezoelectric resonator operates at a resonance frequency on the order of 1 MHZ, and wherein the application-specific circuit includes at least one of: piezo-electric power conversion circuitry, RF (radio frequency) filter circuitry, one or more oscillators, and one or more transformers.

14. The apparatus of claim 11, wherein the at least one center electrode includes a certain center electrode and the band is a conductive ring that at least predominantly surrounds the certain center electrode to facilitate operation by suppressing spurious modes, and the gap dimension is smaller than the width dimension by at least an order of magnitude, and the width dimension and the gap dimension are set to facilitate the TE mode being maintained or enhanced while eliminating lateral spurious tones.

15. The apparatus of claim 11, wherein the electrically-conductive contiguous region of the band adequately surrounds a perimeter of the at least one center electrode to suppress the one or more spurious modes from adversely affecting a Q (quality) factor while maintaining a fractional suppressed region of at least 50% in a range from 50%-75%, and maintaining a spurious-suppressed region to a degree in a range from 0.50 MHz to 1.00 MHz, the width dimension of the band is smaller than the gap dimension by at least an order of magnitude, and the band is configured to enhance TE coupling and therein induce uniform vibration.

16. The apparatus of claim 11, wherein the band is connected to a reference node to electrically load piezoelectric material in the piezoelectric resonator.

17. The apparatus of claim 11, wherein the band includes a non-conductive separation with conductive material on opposite sides of the band, and with the band being connected to a reference node, as ground a rail or as a common terminal, on each of the opposing sides.

18. The apparatus of claim 11, wherein the piezoelectric material in the piezoelectric resonator is electrically loaded to reinforce TE coupling.

19. The apparatus of claim 11, wherein the band is to cause suppression of the one or more spurious modes based at least in part on an isotropic piezoelectric coefficient while causing suppression of an anisotropic coefficient, each of the coefficients being specific to the piezoelectric material in the piezoelectric resonator.

20. The apparatus of claim 11, wherein the band is to cause suppression of the one or more spurious modes while causing suppression of an anisotropic coefficient which is specific to the piezoelectric material in the piezoelectric resonator.

21. A method for use with resonator-based circuitry including a resonator having a center electrode, the method comprising:

operating the resonator-based circuitry at a resonance frequency on the order of 1 MHz with an electrical-conductive band having a contiguously curved region at least predominantly surrounding a center electrode of the resonator-based circuitry; and using the electrical-conductive band, while operating the resonator-based circuitry at the resonance frequency, having a width dimension that is smaller than a gap dimension defining a non-metalized separation between the electrical-conductive band and the center electrode, to maintain TE mode and to suppress one or more spurious modes at least in part by electrically loading piezoelectric material in the resonator.

22. The method of claim 21, wherein the resonator-based circuitry and the electrical-conductive band cooperatively interact by providing piezoelectric power conversion.

23. The method of claim 21, wherein the gap dimension is smaller than the width dimension by at least an order of magnitude, and the width dimension and the gap dimension are set to facilitate the TE mode being maintained or enhanced, while eliminating lateral spurious tones, to facilitate uniform vibration.

* * * * *